US008694567B2

(12) United States Patent
Kodama

(10) Patent No.: US 8,694,567 B2
(45) Date of Patent: Apr. 8, 2014

(54) METHOD AND APPARATUS FOR ARITHMETIC OPERATION ON A VALUE REPRESENTED IN A FLOATING-POINT FORMAT

(75) Inventor: Kohei Kodama, Tokyo (JP)

(73) Assignees: Sony Corporation, Tokyo (JP); Sony Computer Entertainment Inc., Tokyo (JP)

( * ) Notice: Subject to any disclaimer, the term of this patent is extended or adjusted under 35 U.S.C. 154(b) by 1550 days.

(21) Appl. No.: 11/661,375

(22) PCT Filed: Apr. 14, 2005

(86) PCT No.: PCT/JP2005/007250
§ 371 (c)(1),
(2), (4) Date: Jun. 25, 2007

(87) PCT Pub. No.: WO2006/022048
PCT Pub. Date: Mar. 2, 2006

(65) Prior Publication Data
US 2008/0104160 A1    May 1, 2008

(30) Foreign Application Priority Data
Aug. 27, 2004    (JP) ................................. 2004-248395

(51) Int. Cl.
G06F 1/02    (2006.01)
G06F 7/552    (2006.01)
(52) U.S. Cl.
USPC ........................................ 708/272; 708/500
(58) Field of Classification Search
USPC ......................................... 708/500, 502, 272
See application file for complete search history.

(56) References Cited

U.S. PATENT DOCUMENTS

| 6,223,192 B1 * | 4/2001 | Oberman et al. | 708/270 |
| 6,976,043 B2 * | 12/2005 | Clifton | 708/277 |
| 7,440,987 B1 * | 10/2008 | Song et al. | 708/276 |

FOREIGN PATENT DOCUMENTS

| JP | 61292742 A | 12/1986 |
| JP | 6278629 A | 4/1987 |
| JP | 07248841 A | 9/1995 |
| JP | 09-026954 | 1/1997 |
| JP | 200329961 A | 1/2003 |

OTHER PUBLICATIONS

International Search Report dated Jul. 26, 2005 from the corresponding International Patent Application No. PCT/JP2005/007250.

(Continued)

*Primary Examiner* — Chuong D Ngo
(74) *Attorney, Agent, or Firm* — Katten Muchin Rosenman LLP

(57) ABSTRACT

Precision of arithmetic operations on floating-point numbers is improved while also preventing an increase in the amount of processing. A second converter converts an exponent included in an exponent field according to an exponent conversion rule defined in accordance with a function. A storage stores in a table a value obtained by converting a mantissa field according to a mantissa conversion rule defined in accordance with the function. A retrieving unit derives an index of the table, by extracting the most significant 8 bits from the 23 bits constituting the mantissa field. The retrieving unit adds 1 to the mantissa field approximated by the most significant 8 bits so as to derive a second index. A deriving unit derives a tentative return value A and a tentative return value B. Further, the deriving unit interpolates between the tentative return value A and the tentative return value B so as to derive a return value of the function.

8 Claims, 9 Drawing Sheets

(56) References Cited

OTHER PUBLICATIONS

International Preliminary Examination Report on Patentability (I) from the corresponding International Patent Application No. PCT/JP2005/007250; English translation attached.

Japanese Office Action dated Mar. 13, 2007 from the corresponding Japanese Patent Application No. 2004-248395; English translation attached.

Decision of Refusal dated Jul. 31, 2007, for the corresponding Japanese Patent Application 2004-248395.

* cited by examiner

| INDEXES | ENTRIES |
|---------|---------|
| 0 | $C_0$ |
| 1 | $C_1$ |
| ⋮ | ⋮ |
| 255 | $C_{255}$ |
| 256 | $C_{256}$ |

| INDEXES | ENTRIES |
|---|---|
| 0 | 0x3504f3 |
| 1 | 0x3450fc |
| ⋮ | ⋮ |
| 126 | 0x80c1 |
| 127 | 0x4030 |
| 128 | 0x7fffff |
| 129 | 0x7f017d |
| ⋮ | ⋮ |
| 255 | 0x355fb9 |
| 256 | 0x3504f3 |

38

METHOD AND APPARATUS FOR ARITHMETIC OPERATION ON A VALUE REPRESENTED IN A FLOATING-POINT FORMAT

This application is a National Phase Application of International Application No. PCT/JP2005/007250, filed Apr. 14, 2005, which claims the benefit under 35 U.S.C. 119 (a-e) of Japanese Application No. 2004-248395 filed Aug. 27, 2004, which is herein incorporated by reference.

BACKGROUND OF THE INVENTION

1. Field of the Invention

The present invention relates to a computing technology and, more particularly, to a method and apparatus for arithmetic operation on a value represented in a floating-point format.

2. Description of the Related Art

Fixed-point numbers and floating-point numbers are known as methods for dealing with numbers in a computer or a digital signal processor (DSP). A floating-point number requires an operation on fractions. Therefore, the speed of computing a floating-point number tends to be lower than that of computation a fixed-point number in which the base point is fixed at a certain position. Meanwhile, since the base point of a floating-point number can be changed, the floating-point format can represent a number with a small absolute value with high precision and is also capable of representing a number with a large absolute value.

Pixel pipelines in graphics hardware perform lighting computation and image processing. Such computation includes normalization of vectors, computation of inverse matrices and the like. In this process, reciprocals and inverse square roots are computed. Conventionally, a pixel pipeline operates on integers. Thus, computation of reciprocals and inverse square roots is based on an integer table and linear interpolation between integers. However, a growing number of pixel pipelines implemented in recent years support floating-point arithmetic. In this background, there is a demand for high-speed computation of reciprocals and inverse square roots of floating-point numbers. The demand is particularly high in arithmetic operations for realtime graphics. With the trend for increased number of parallel processing pipelines, it is desirable that hardware resources used be minimized in respect of cost.

SUMMARY OF THE INVENTION

In this background, a general purpose of the present invention is to provide a method and apparatus for arithmetic operation capable of reducing the amount of arithmetic operations on numbers represented in the floating-point format.

An embodiment of the present invention relates to an arithmetic unit. The arithmetic unit comprises: an input unit which receives an argument of a function represented in a floating-point format that includes an exponent field and a mantissa field; a converter which converter the exponent field included in the input argument according to an exponent conversion rule defined in accordance with the function; a storage which stores in a table a value obtained by converting the mantissa field included in the argument according to a mantissa conversion rule defined in accordance with the function; a retrieving unit which derives a plurality of indexes of the table stored in the storage, by approximating at least the mantissa field of the input argument, and which retrieves a plurality of values from the table stored in the storage, by using the plurality of indexes thus derived; and a deriving unit which derives a return value of the function represented in the same floating-point format as that of the argument, in accordance with the converted exponent field and the plurality of values retrieved, and which outputs the return value. The number of indexes in the table in this unit may be defined to be a sum of 1 and the maximum number taken by the approximate value of at least the mantissa field of the argument.

The "exponent conversion rule defined in accordance with the function" and the "mantissa conversion rule defined in accordance with the function" are rules defined in accordance with a function to be computed and are rules for converting an exponent field and a mantissa field, respectively.

Table-based reduction in the amount of processing according to this embodiment is such that the number of indexes is defined by a sum of 1 and the maximum number that the index can take. Accordingly, a value larger than the approximate value using a part of the argument and a value smaller than that can be used as indexes so that precision in the return value is improved.

The function corresponding to the argument received by the input unit may be an operation for computing a reciprocal of the argument, a value approximating the mantissa field of the argument by high-order bits of the mantissa field may be defined as the index of the table and stored in the storage, and the retrieving unit may derive an approximate value of the mantissa field of the argument using high-order bits of the mantissa field and a value obtained by adding 1 to the approximate value as the plurality of indexes of the table.

The "value approximating the mantissa field of the argument by high-order bits of the mantissa field" is represented by predetermined high-order bits extracted from a plurality of bits constituting the mantissa field. The approximate value may have a different number of bits from the number of bits of the original mantissa field but is a valid approximation since the same bit pattern is included in the bit arrays.

The function corresponding to the argument received by the input unit may be an operation for computing an inverse square root of the argument, a value formed by the least significant bit of the exponent in the argument and by an approximate value of the mantissa field of the argument using high-order bits of the mantissa field is defined as the index of the table and stored in the storage, and the retrieving unit derives, as the plurality of indexes of the table: a value formed by the least significant bit of the exponent field of the input argument and by an approximate value of the mantissa field using high-order bits of the mantissa field; and a value obtained by adding 1 to the value thus formed.

The "value formed by the least significant bit of the exponent in the argument and by an approximate value of the mantissa field of the argument using high-order bits of the mantissa field" is a value obtained by combining the predetermined high-order bits extracted from the plurality of bits constituting the mantissa field with the least significant bit of the exponent field Approximation may be done as described above.

Another embodiment of the present invention relates to an arithmetic method. The method comprises receiving an argument of a function represented in a floating-point format that includes an exponent field and a mantissa field; converting the exponent field included in the input argument according to an exponent conversion rule defined in accordance with the function; deriving, in order to refer to a table storing a value obtained by converting the mantissa field included in the argument according to a mantissa conversion rule defined in accordance with the function, a plurality of indexes of the table, by approximating at least the mantissa field of the input argument, and retrieving a plurality of values from the table, by using the plurality of indexes thus derived; and deriving a return value of the function represented in the same floating-point format as that of the argument, in accordance with the converted exponent field and the plurality of values retrieved, and outputting the return value. The number of indexes in the table referred to in the retrieving may be defined to be a sum of 1 and the maximum approximate value of at least the mantissa field of the argument.

Another embodiment of the present invention relates to a program. The program comprises: receiving via a predetermined interface an argument of a function represented in a floating-point format that includes an exponent field and a mantissa field; converting the exponent field included in the input argument according to an exponent conversion rule defined in accordance with the function; deriving, in order to refer to a table storing in a memory a value obtained by converting the mantissa field included in the argument according to a mantissa conversion rule defined in accordance with the function, a plurality of indexes of the table, by approximating at least the mantissa field of the input argument, and retrieving a plurality of values from the table, by accessing the memory using the plurality of indexes thus derived; and deriving a return value of the function represented in the same floating-point format as that of the argument, in accordance with the converted exponent field and the plurality of values retrieved, and outputting the return value. The number of indexes in the table referred to in the retrieving may be defined to be a sum of 1 and the maximum approximate value of at least the mantissa field of the argument.

Arbitrary combinations of the aforementioned constituting elements, and implementations of the invention in the form of methods, apparatuses, systems, recording mediums and computer programs may also be practiced as additional modes of the present invention.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which:

FIG. 9 shows the data structure of a table stored in a storage according to a third embodiment of the present invention.

DETAILED DESCRIPTION OF THE INVENTION

The invention will now be described based on the following embodiments which do not intend to limit the scope of the present invention but exemplify the invention. All of the features and the combinations thereof described in the embodiments are not necessarily essential to the invention.

First Embodiment

A summary of the invention will be given before describing the embodiments. The first embodiment of the present invention relates to an image display apparatus for performing lighting computation and image processing in order to generate an image to be displayed on a display device or the like. More specifically, it relates to an arithmetic unit for computing reciprocals of floating-point numbers. The computing unit according to the embodiment receives a floating-point argument composed of a sign field, an exponent field and a mantissa field and decomposes the argument into a sign field, an exponent field and a mantissa field. The arithmetic unit performs subtraction between a pre-stored value and an exponent field. The subtraction corresponds to computing reciprocals.

Values obtained by converting the mantissa field to correspond to reciprocals are stored in a table. Indexes of the table are formed by high-order bits of the mantissa field. The total number of indexes is defined by a sum of 1 and the number that can be represented by the high-order bits of the mantissa field. For generation of an index, the arithmetic unit extracts the high-order bits of the mantissa field. The arithmetic unit further adds 1 to the high-order bits thus extracted in order to generate a second index. Subsequently, the two indexes thus generated are used to refer to the table to retrieve values corresponding to two entries. The arithmetic unit synthesizes the values corresponding to the two entries with the sign field and the exponent field subjected to subtraction, thereby generating two tentative return values. Finally, the arithmetic unit interpolates between the two tentative return values so as to generate a return value.

The arithmetic unit performs subtraction on the exponent field and performs table-based conversion of the mantissa field. Because multiplication and subtraction, which are generally characterized by a large amount of processing, are used only for interpolation, the overall amount of processing is reduced. Since the high-order several bits of the mantissa field are used as the index of the table, it is ensured that the table is relatively small in size. By maintaining a relatively small size of the table and performing interpolation at the same time, precision is prevented from being dropped. Since the total number of indexes is defined by a sum of 1 and the number that can be represented by the several high-order bits of the mantissa field, the arithmetic unit is capable of performing interpolation even if the several high-order bits of the mantissa field included in the input argument represent a maximum value.

Figure 1:
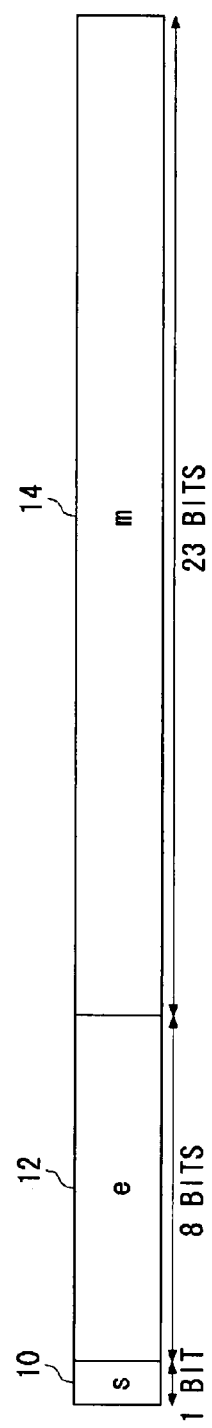
FIG. 1 shows the format of a floating-point number according to a first embodiment of the present invention.

Before describing the structure of the arithmetic unit of the embodiment, a description will be given of an algorithm for computing reciprocals according to the embodiment. FIG. 1 shows the format of a floating-point number according to the first embodiment of the present invention. A sign field 10 denotes the sign of a numerical value and comprises a one-bit unsigned integer. An exponent field 12 contains an integer denoting a power of 2 and comprises an 8-bit unsigned integer. A mantissa field 14 represents a value between 1.0 and 2.0 and comprises an 23-bit unsigned integer. As illustrated, letting "s" represent the sign field 10, "e" the exponent field 12 and "m" the mantissa field 14, these fields together represent the following floating-point number x, which denotes an argument of a function.

$$x=(-1)^{s}*2^{e-127}*(1+m/2^{23}).\qquad\text{(expression 1)}$$

Representing a return value 1/x of the function, where x is as expressed above, we obtain the following expression.

$$1/x=1/\{(-1)^{s}*2^{e-127}*(1+m/2^{23})\}.\qquad\text{(expression 2)}$$

Modifying 1/x, we obtain the following:

$$\begin{aligned}1/x &= (-1)^{s}*2^{127-e}*1/(1+m/2^{23}) &\text{(expression 3)}\\ &= (-1)^{s}*2^{127-e-1}*2/(1+m/2^{23})\\ &= (-1)^{s}*2^{(253-e)-127}*2/(1+m/2^{23})\\ &= (-1)^{s}*2^{(253-e)-127}*(1+(1-m/2^{23})/\\ &\quad (1+m/2^{23}))\\ &= (-1)^{s}*2^{(253-e)-127}*(1+(2^{23}-m)/\\ &\quad (2^{23}+m)*2^{23}/2^{23}).\end{aligned}$$

The value obtained by converting the exponent field 12 (hereinafter, referred to as "converted exponent field") will be denoted as e'. The value obtained by converting the mantissa field 14 (hereinafter, referred to as "converted mantissa field") will be denoted as m'. e' and m' are expressed as below.

$$e'=253-e(e'=0\text{ when }e\geq 254)\qquad\text{(expression 4)}$$

$$m'=(2^{23}-m)/(2^{23}+m)*2^{23}.\qquad\text{(expression 5)}$$

Using the converted exponent and the converted mantissa as given above, 1/x is given by:

$$1/x=(-1)^{s}*2^{e'-127}*(1+m'/2^{23}).\qquad\text{(expression 5)}$$

This means that a reciprocal (1/x) of x is computed once the converted exponent field and the converted mantissa field are respectively derived from the exponent field 12 and the mantissa field 14 of the argument x. The converted exponent field is computed by 8-bit subtraction. The converted mantissa field, however, cannot be computed by a simple arithmetic unit. Therefore, a table is used. If the 23 bits of the mantissa field 14 is used as an index of the table, the table will grow considerably. Therefore, the most significant 8 bits of the mantissa field 14 are used in the table. The aforementioned approach is given by:

$$m'=\text{table0}[m[0:7]]\qquad\text{(expression 6)}$$

table0[m[0:7]] represents a value (i.e., an entry value in the table) retrieved from the table by using the most significant 8 bits of the mantissa field 14 as an index. The entry value represents the converted mantissa field. The size of an entry in the table is 23 bits. table0[i], the ith entry in the table, stores an integer representing the value $(2^{23}-i)/(2^{23}+i)*2^{23}$. Since the table size is 23 bits, the entry value is set to $2^{23}-1$ if the value entered exceeds $2^{23}-1$.

Retrieving a single entry value and using the retrieved value as a converted mantissa field will approximately result in 8-bit precision of the mantissa field. This embodiment provides that a table having 257 entries is prepared, where 257 is derived by adding 1 to the value that can be represented by the index. Two adjacent indexes are generated from the most significant 8 bits of the mantissa field 14 and a value obtained by adding 1 to the 8 bits. The two indexes are used to retrieve two entry values. An approximate solution is derived with improved precision by interpolating between the two entries.

An entry value retrieved by using the smaller of the two indexes will be referred to as a converted mantissa field A, and an entry value retrieved by using the larger of the two indexes will be referred to as a converted mantissa field B. Denoting the converted mantissa field A as m' and the converted mantissa field B as m", a tentative return value "a" (hereinafter, referred to as a "tentative return value A") corresponding to the converted mantissa field A and a tentative return value "b" (hereinafter, referred to as a "tentative return value B") corresponding to the converted mantissa field B are expressed as follows.

8-bit integer operation is performed on the exponent field 12 of the argument x, and an entry is retrieved by using the most significant 8 bits of the mantissa field 14 as an index. In this way, the tentative return value A is computed. If a negative value of e' results, the value of e' is set to 0. The tentative return value B is derived similarly to the tentative return value A except that a value obtained by adding 1 to the most significant 8 bits of the mantissa field 14 is used as an index.

$$e'=253-e\qquad\text{(expression 7)}$$

m'=table0[m[0:7]]

$$a=(-1)^{-s}*2^{e'-127}*(1+m'/2^{23})\qquad\text{(expression 8)}$$

$$e'=253-e\qquad\text{(expression 9)}$$

m"=table0[m[0:7]+1]

$$b=(-1)^{-s}*2^{e'-127}*(1+m''/2^{23})\qquad\text{(expression 10)}$$

Letting c denote a value obtained by converting the least significant 15 bits of the mantissa field 14 into a 32-bit floating-point number, 1/x is given by:

$$c=m[8:22]/2^{15}\qquad\text{(expression 11)}$$

$$1/x=(1/x_1-1/x_0)*(m[8:22]/2^{15})+1/x_0=(b-a)*c+a.\qquad\text{(expression 12)}$$

As described, 1/x is derived by interpolating between a and b in accordance with c. According to this algorithm, interpolation can still be performed using "256" and "257" as indexes, even if the most significant 8 bits of the mantissa field 14 is at a maximum. The arithmetic unit according to this embodiment is configured to perform the operations of expressions 10 through 12.

A verification is necessary to ensure that the converted values e' and m' fall within an appropriate range. Since $0\leq e\leq 255$, it should be that $0\leq e'\leq 253$. Further, since $0\leq m<2^{23}$, $0<m'=(2^{23}-m)/(2^{23}+m)*2^{23}\leq 2^{23}$. Since m' is obtained from the table, it does not occur that $m'=2^{23}$. Therefore, it ensured that $0<m'=(2^{23}-m)/(2^{23}+m)*2^{23}<2^{23}$. That is, e' can be represented by an 8-bit unsigned integer, and m' can be represented by a 23-bit unsigned integer.

Figure 2:
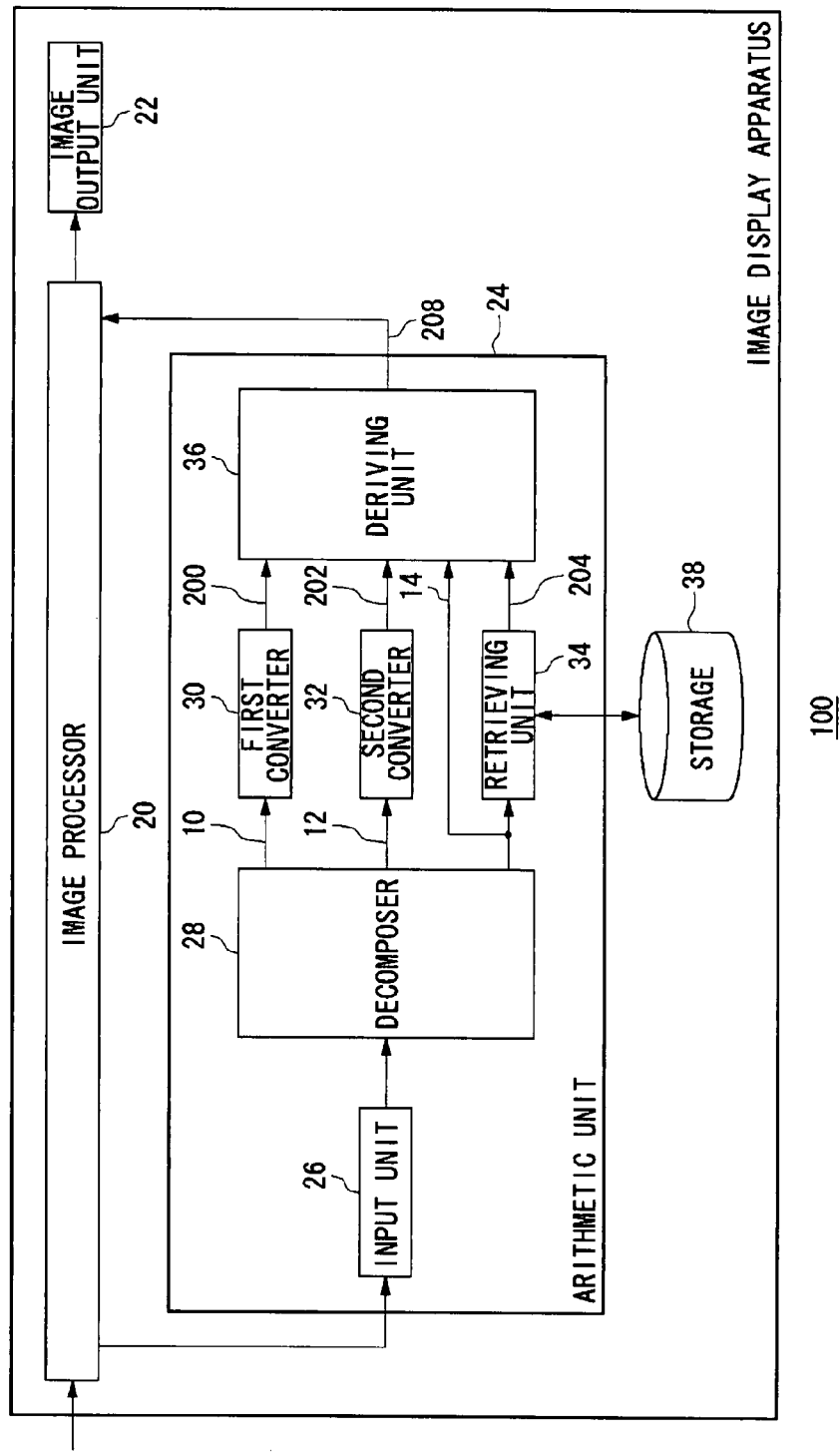
FIG. 2 shows the structure of an image display apparatus according to the first embodiment of the present invention.

FIG. 2 shows the structure of an image display apparatus 100 according to the first embodiment of the present invention. The image display apparatus 100 includes an image processor 20, an image output unit 22, an arithmetic unit 24 and a storage 38. The arithmetic unit 24 includes an input unit 26, a decomposer 28, a first converter 30, a second converter 32, a retrieving unit 34 and a deriving unit 36. Signals involved are a converted sign field 200, a converted exponent field 202, a converted mantissa field 204 and a return value 208.

For generation of an image, the image processor 20 performs lighting computation and image processing. For example, the image processor 20 computes lighting in order to generate a sphere by using a surface model or the like in computer graphics. The lighting computation requires computation of reciprocals to derive normalized vectors. When computation of a reciprocal is required, the image processor 20 outputs an argument to the arithmetic unit 24. Upon receiving a return value (i.e., the reciprocal thus calculated) from the arithmetic unit 24, the image processor 20 generates an image by using the reciprocal. The image output unit 22 displays an image generated by the image processor 20. The image output unit 22 is implemented by a display or the like.

As shown in FIG. 1, the input unit 26 receives an argument of a function represented in the floating-point format including the sign field 10, the exponent field 12 and the mantissa field 14. The argument is input from the image processor 20.

The decomposer 28 decomposes the input argument into the sign field 10, the exponent field 12 and the mantissa field 14. The decomposer 28 outputs the sign field 10 to the first converter 30, outputs the exponent field 12 to the second converter 32 and outputs the mantissa field 14 to the retrieving unit 34 and the deriving unit 36.

The first converter 30 subjects the sign field 10 to a predetermined conversion operation. If the function is for computing a reciprocal, the sign field 10 of the argument and that of the return value are of the identical value, as shown in expression 5. That is, the first converter 30 outputs the input sign field 10 to the deriving unit 36 unmodified. The sign field 10 output from the first converter 30 to the deriving unit 36 will be referred to as the converted sign field 200.

The second converter subjects the exponent included in the exponent field 12 to conversion according to an exponent conversion rule defined in accordance with the function. Since the function is for computing a reciprocal, the conversion rule is subtraction whereby the exponent field 12 is subtracted from "253", as indicated by expressions 4, 7 and 9. Where the sign field 10 is "254" or greater, the result of subtraction is set to "0". The result of subtraction is output to the deriving unit 36 as the converted exponent field 202. The converted exponent field 202 corresponds to e' of expressions 4, 7 and 9.

Figures 3, 4:
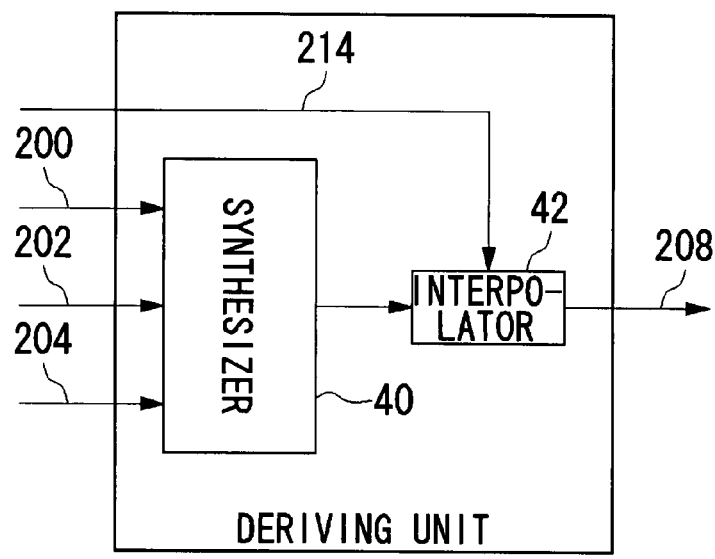
FIG. 3 shows the data structure of a table stored in a storage of FIG. 2.
FIG. 4 shows the structure of a deriving unit of FIG. 2.

The storage 38 stores a value obtained by converting the mantissa field 14 according to a mantissa conversion rule defined in accordance with the function. Since the function is for computing a reciprocal, the conversion rule is represented by expression 4 for computing m'. The table stored in the storage 38 uses the most significant 8 bits of the mantissa field 14 as an index. That is, an approximate value of the argument is used as an index. The maximum value represented by the most significant 8 bits of the mantissa field 14 is 256. Meanwhile, the number of indexes in the table is defined to be 257 (=256+1). The storage 38 stores m' of expression 4 as entries. FIG. 3 shows the data structure of the table stored in the storage 38. A total of 257 "indexes" from "0" to "256" are defined. "Entries" from "C0" to "C256" corresponding to the "indexes" are stored. "C0" is a value obtained by substituting "0" into m of expression 4 for computing m', and "C1" is a value obtained by substituting "1" into m.

Referring back to FIG. 2, the retrieving unit 34 derives the index of the table stored in the storage 38, by extracting the most significant 8 bits from the 23 bits constituting the mantissa field 14, i.e., by approximating the mantissa field 14 by the most significant 8 bits. In order to derive two indexes, the retrieving unit 34 additionally derives a number by adding 1 to the 8 bits which approximate the mantissa field 14. As a result of the above operations, the retrieving unit 34 derives the two indexes. Subsequently, the retrieving unit 34 retrieves two entry values from the table stored in the storage 38, by using the two indexes. More specifically, the retrieving unit 34 retrieves from the table of FIG. 3 a converted mantissa field 204A and a converted mantissa field 204B, two entry values corresponding to the two indexes. The two entry values retrieved correspond to m' of expression 7 and m" of expression 9, respectively. The two entry values are output to the deriving unit 36 as the converted mantissa fields 204. In case the storage 38 is implemented by a storage medium such as a memory, the index may correspond to the address.

The deriving unit 36 synthesizes the converted sign field 200, converted exponent field 202 with each of the two converted mantissa fields 204 retrieved by the retrieving unit 34, so as to derive the tentative return value A and the tentative return value B represented in the same floating-point format as that of the argument. The tentative return value A corresponds to "a" of expression 8 and the tentative return value B corresponds to "b" of expression 10. The term "the same floating-point format as that of the argument" refers to the format shown in FIG. 1. The converted sign field 200, the converted exponent field 202 and the converted mantissa field 204 are arranged in the stated order. Further, the deriving unit 36 derives a return value 208 of the function by interpolating between the tentative return value A and the tentative return value B, using the least significant 15 bits of the mantissa field 14. Before the interpolation, the least significant 15 bits of the mantissa field 14 is converted into a floating-point number c. Interpolation using a, b and c is achieved by linear interpolation according to expression 12.

The structure as described above may be implemented by hardware including a CPU, a memory or other LSIs in an arbitrary computer and by software including a program loaded into the memory. FIG. 2 depicts functional blocks implemented by cooperation of the hardware and software. Therefore, it will be obvious to those skilled in the art that the functional blocks may be implemented by a variety of manners including hardware only, software only or a combination of both.

FIG. 4 shows the structure of the deriving unit 36. The deriving unit 36 includes a synthesizer 40 and an interpolator 42. The synthesizer 40 generates a tentative return value by synthesizing the converted sign field 200, the converted exponent field 202 and the converted mantissa fields 204. The tentative return value A and the tentative return value B are generated in association with the two converted mantissa fields 204. Generation is merely a process of arranging the converted sign field 200, the converted exponent field 202 and the converted mantissa field 204 as shown in FIG. 1. The synthesizer 40 outputs the tentative return value A and the tentative return value B to the interpolator 42.

The interpolator 42 subjects the tentative return value A and the tentative return value B to linear interpolation so as to generate a return value 208. To achieve interpolation, the value obtained by converting the least significant 15 bits of the mantissa field 14 into a floating-point number is used. As previously mentioned, the tentative return value A, the tentative return value B and the converted value are denoted by a, b and c of expression 12. The return value 208 is denoted by 1/x of expression 12. c is an indicator which denotes how close the mantissa field 14 is to the most significant 8 bits of the mantissa field 14 used as the index. If the mantissa field 14 is far from the most significant 8 bits of the mantissa field 14, it means that the mantissa field 14 is closer to the other index.

Figure 5:
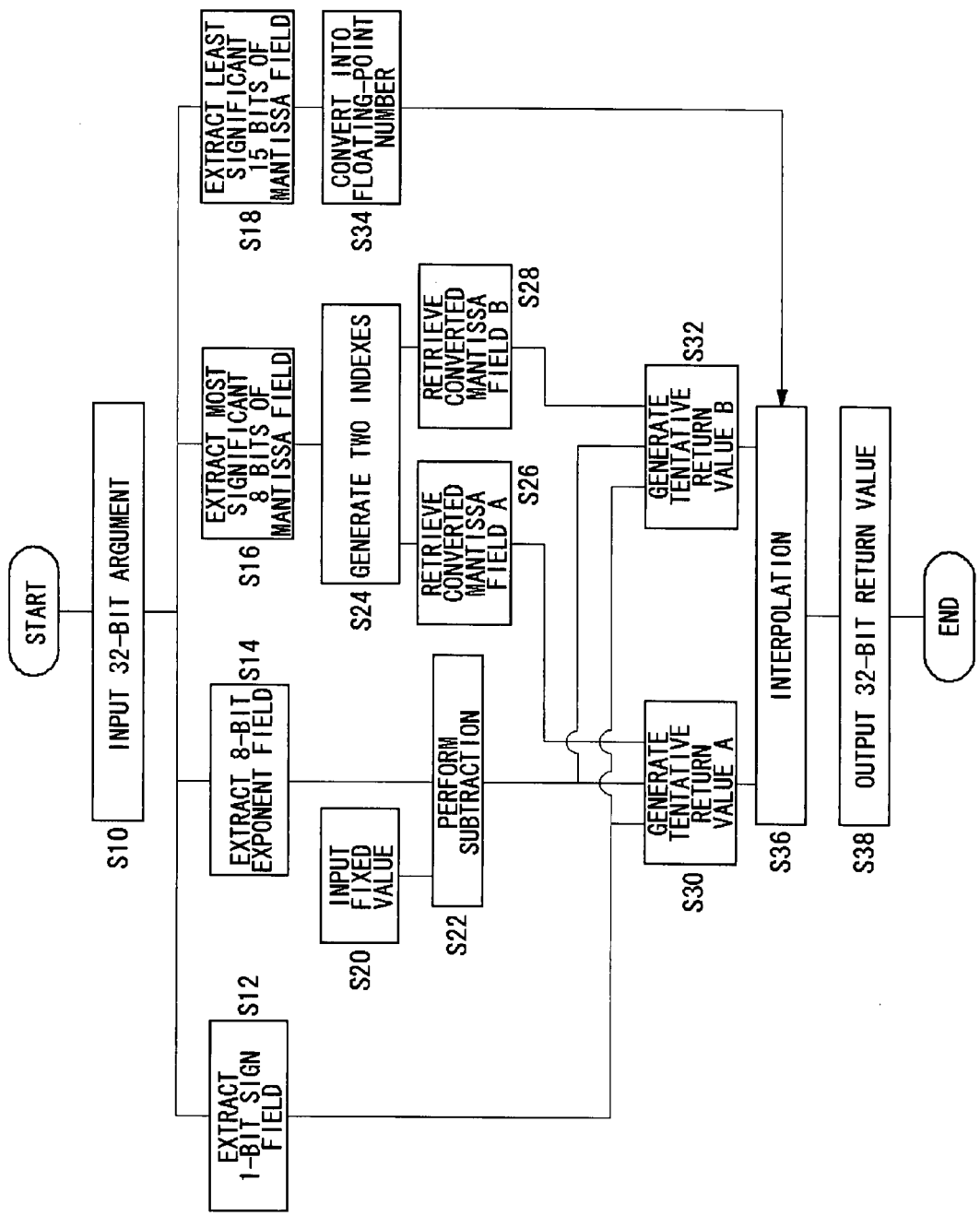
FIG. 5 is a schematic view showing the procedure of arithmetic operation by an arithmetic unit of FIG. 2.

FIG. 5 is a schematic view showing the procedure for arithmetic operation. The input unit 26 receives an argument of 32 bits (S10). The decomposer 28 decomposes the input argument. More specifically, the decomposer 28 extracts the sign field 10 of 1 bit (S12), extracts the exponent field 12 of 8 bits (S14) and extracts the most significant 8 bits of the mantissa field 14 (S16). The first converter 30 outputs the sign field 10 as the converted sign field 200. The second converter 32 receives a fixed value "253" (S20) and performs subtraction on the fixed value and the exponent field 12 (S22) so as to output the converted exponent field 220. The retrieving unit 34 generates two indexes from the most significant 8 bits of the mantissa field 14 (S24), retrieves the converted mantissa field 204A from the storage 38 by referring to the index (S26) and retrieves the converted mantissa field 204B (S28).

The synthesizer 40 generates the tentative return value A from the converted sign field 200, the converted exponent field 202 and the converted mantissa field 204A (S30) and also generates the tentative return value B from the converted sign field 200, the converted exponent field 202 and the converted mantissa field 204B (S32). The interpolator 42 extracts the least significant 15 bits of the mantissa field 14 (S18) so as to convert the least significant 15 bits of the mantissa field 14 into a floating-point number (S34). Further, the interpolator 42 interpolates between the tentative return value A and the tentative return value B on the basis of the converted floating-point number (S36) so as to generate a return value. Finally, the interpolator 42 outputs a 32-bit return value (S38).

Figure 6A:
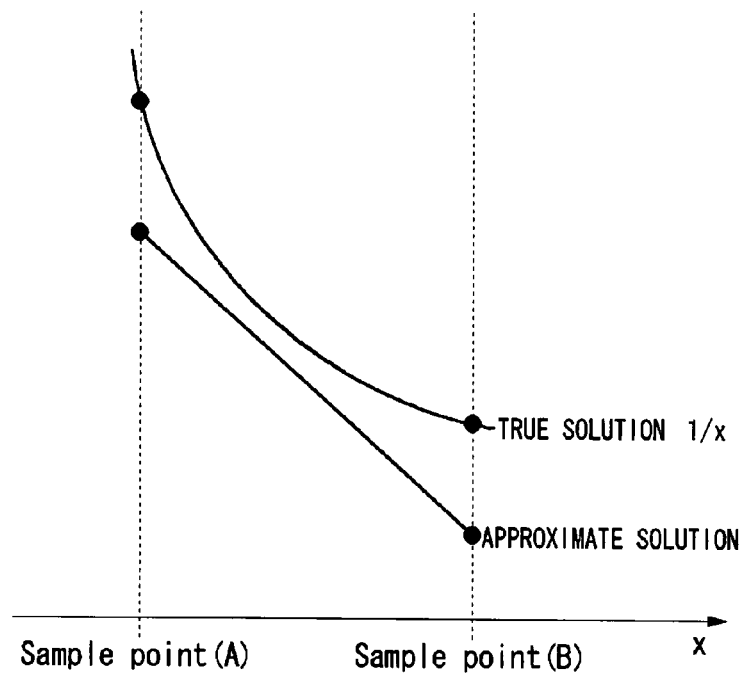
FIGS. 6A-6B show the relationship between an approximate solution obtained by the arithmetic unit of FIG. 2 and a true solution.
Figure 6B:
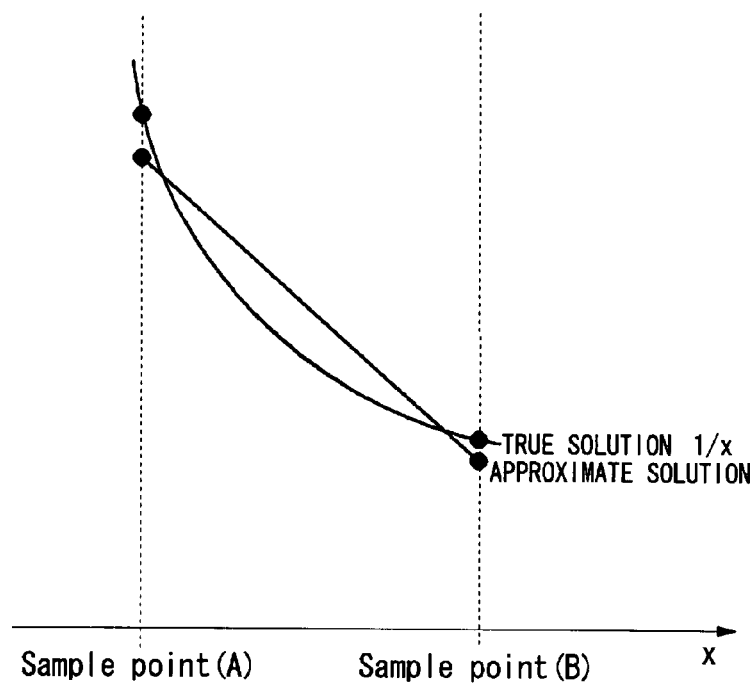

FIGS. 6A-6B show the relationship between an approximate solution obtained by the arithmetic unit 24, i.e., 1/x of expression 12, and a true solution. An explanation will be given, with reference to FIGS. 6A and 6B, of why precision is improved by interpolation according to this embodiment. FIG. 6A shows an approximate solution obtained by the interpolation according to this embodiment. Sample point (A) and Sample point (B) in the horizontal axis denote discrete values corresponding to indexes of the table. The vertical axis represents an entry corresponding to the index and an approximate solution.

As indicated above, Sample point (A) and Sample point (B) are values that refer to adjacent entries. An approximate solution between A and B is computed by interpolation. In this embodiment, an approximate solution at Sample point obtained by using a linear interpolation coefficient of 0.0, i.e., the entry value itself, is derived from masking the least significant 14 bits of the mantissa field 14 (true solution) having a value represented in the 32-bit floating-point format. Accordingly, if the input x≥0, it is ensured that the approximate solution at Sample point is smaller than the true solution. A negative input would result in symmetry about the origin and will not change the nature of discussion, so that the description for the case of negative input will be omitted. The secondary differential coefficient of the true solution is given by:

$(d^2/dx^2)\{1/x\}=(d/dx)\{-1/x^2\}=2/x^3$. (expression 13)

When x≥0, the secondary differential coefficient of the curve remains positive. Thus, the curve is bulged toward downward as shown. That is, the relationship between a true solution and an approximate value is as shown in FIG. 6A or FIG. 6B. In the case of FIG. 6A, an error in a segment between adjacent Sample point (A) and Sample point (B) is at a minimum at the center of the segment. In the case of FIG. 6B, an error in a segment between Sample point (A) and Sample point (B) is at a maximum at the center of the segment.

Meanwhile, this embodiment uses the 8 bits of the mantissa field 14 in the floating-point format as an index. In this case, the relationship between a true solution and an entry is not as shown in FIG. 6B but as shown in FIG. 6A. An error in a segment between Sample point (A) and Sample point (B) is at a minimum at the center of the segment. That is, the precision of the approximate solution in a segment between Sample point (A) and Sample point (B) would not be less than the precision at other Sample points. The above explanation not only applies to 1/x but to other functions as well.

According to the embodiment, the indexes of the table are generated from approximate values of the mantissa field. Accordingly, the table size is reduced. Since a value obtained by adding 1 to the maximum number that the approximate value can take is defined as the number of indexes, multiple indexes can be generated for each of the approximate values. Therefore, the precision of the return value is improved. The exponent field is only subjected to subtraction so that the amount of processing is reduced. Since the return value is derived by interpolating between multiple values retrieved from the table, the precision of the return value is improved. Further, reciprocals can be computed with high precision while also preventing an increase in the amount of processing. Since multiplication is performed only in interpolation, the amount of processing can be reduced.

Since floating-point arithmetic is performed by applying linear interpolation once, the amount of processing is reduced. Further, computation of reciprocals with at least 17-bit precision is possible. The table enables computation of reciprocals by storing 23-bit entries indexed by 257 indexes. Tradeoff between precision and the capacity of a static random access memory (SRAM) may be controlled, by reducing the bit size of each entry.

Second Embodiment

Similarly to the first embodiment, the second embodiment relates to an arithmetic unit for computing the reciprocal of an argument in floating-point representation. Similarly to the unit of the first embodiment, the arithmetic unit according to the second embodiment refers to a table and uses two indexes to retrieve values corresponding to two entries, i.e., retrieve two converted mantissa fields. A difference from the unit of the first embodiment is that the arithmetic unit of the second embodiment interpolates between the two converted mantissa fields before generating a return value by synthesizing the interpolated values, the converted sign field and the converted exponent field. That is, the order of performing interpolation and synthesis differs from that of the first embodiment.

The image display apparatus 100 according to the second embodiment is of the same type as the image display apparatus shown in FIG. 2 so that the description thereof is omitted.

Figure 7:
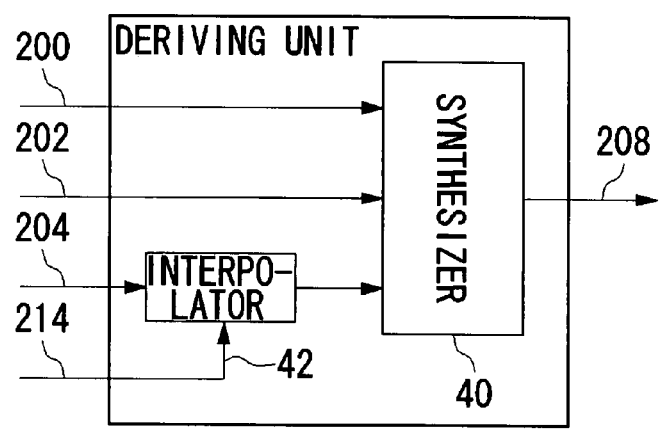
FIG. 7 shows the structure of a deriving unit according to a second embodiment of the present invention.

FIG. 7 shows the structure of the deriving unit 36 according to the second embodiment. The deriving unit 36 includes the interpolator 42 and the synthesizer 40. The deriving unit 36 of FIG. 7 differs from the deriving unit 36 of FIG. 4 in the order in which the synthesizer 40 and the interpolator 42 are arranged.

The interpolator 42 interpolates between the two converted mantissa fields 204 input from the retriever 34 (not shown). That is, the interpolator interpolates between the converted mantissa field 204A and the converted mantissa field 204B. The interpolator 42 uses a value obtained by converting the least significant 15 bits of mantissa field 14 into a floating-point number. More specifically, linear interpolation is performed by replacing "a" in expression 12 by "m'" and "b" by "m'''". The resultant value (hereinafter, referred to as an "interpolated mantissa field") is a substitute for 1/x in expression 12. The nature of the value "c" and the like remains unchanged from the first embodiment so that the description thereof is omitted. The interpolator 42 outputs the interpolated mantissa field to the synthesizer 40.

The synthesizer 40 generates the return value 208 by synthesizing the converted sign field 200, the converted exponent field 202 and the converted mantissa field. The generation is merely a process for arranging the converted sign field 200, the converted exponent field and the interpolated mantissa field from left to right. The synthesizer 40 outputs the return value 208.

Figure 8:
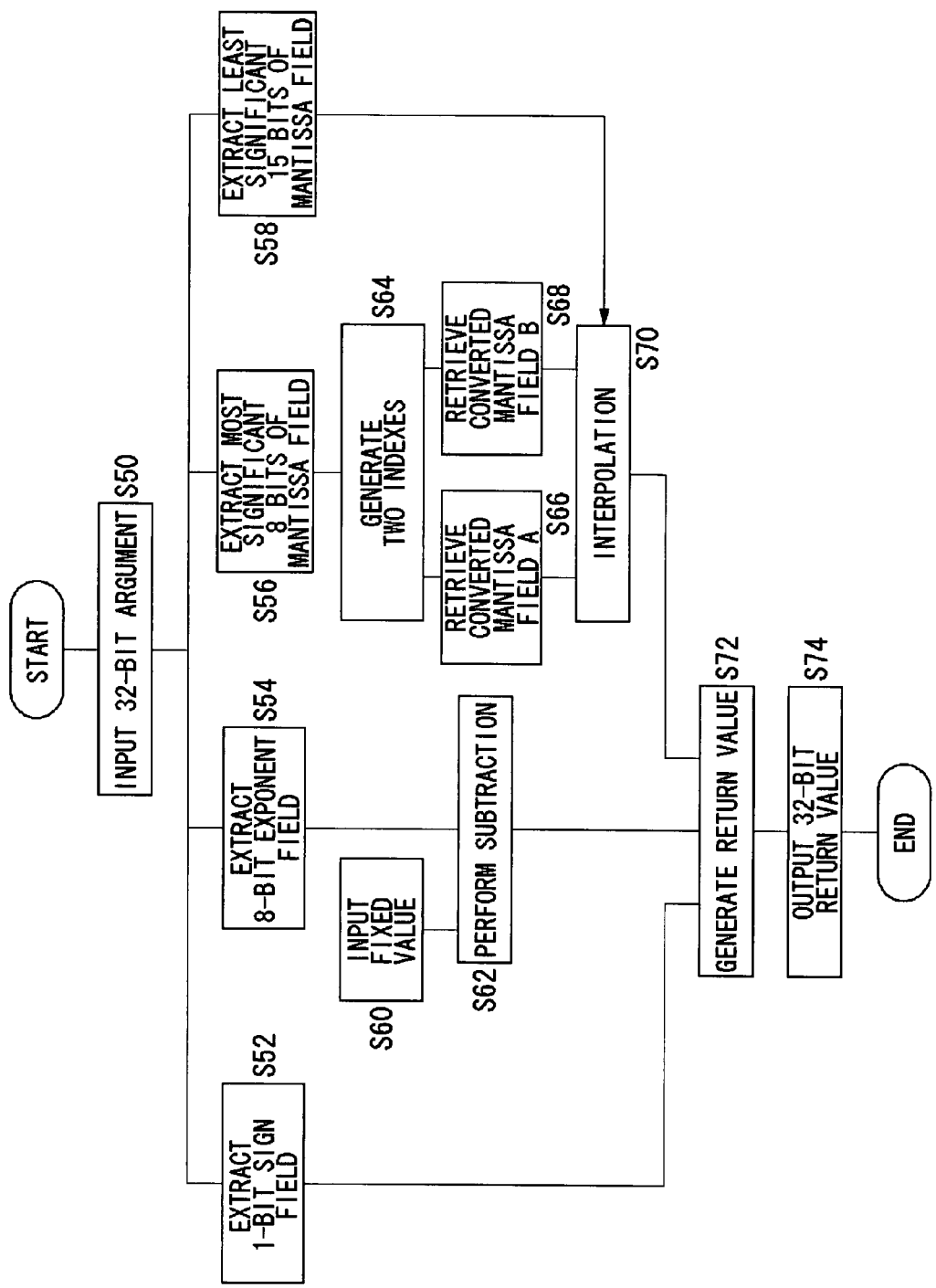
FIG. 8 is a schematic view showing the procedure for arithmetic operation by an arithmetic unit including the deriving unit of FIG. 7.

FIG. 8 is a schematic view showing the procedure for arithmetic operation by the arithmetic unit 24. Step 50 through step 68 correspond to step 10 through step 28 of FIG. 5 so that the description thereof is omitted. The interpolator 42 interpolates between the converted mantissa field A and the converted mantissa field B by using the least significant 15 bits of the mantissa field 14 (S70) so as to generate the interpolated mantissa field for output to the synthesizer 40. The synthesizer 40 generates the return value of the function by synthesizing the converted sign field 200, the converted exponent field 202 and the interpolated mantissa field (S72). Further, the synthesizer outputs the 32-bit return value (S74).

The second embodiment provides the same advantages as those of the first embodiment. Since interpolation is applied to the converted mantissa fields having fewer bits than the tentative return values, the amount of processing is reduced accordingly. Since the amount of processing is reduced, processing speed is increased and power consumption is reduced.

Third Embodiment

The third embodiment differs from the foregoing embodiments and relates to an arithmetic unit which computes an inverse square root of an argument represented in the floating-point format. Like the units of the foregoing embodiments, the arithmetic unit according to the third embodiment decomposes an argument into a sign field, an exponent field and a mantissa field, derives a converted exponent field by subjecting the exponent field to subtraction, stores converted mantissa fields as entries in a table and retrieves two converted mantissa fields by using two indexes. Further, two tentative return values are derived by synthesizing the two converted mantissa fields with the sign field and the exponent field. Finally, the arithmetic unit derives a return value by interpolating between the two tentative return values.

The arithmetic unit according to the third embodiment, however, uses a method for deriving indexes different from that of the foregoing embodiments. The index comprises 8 bits, of which 1 bit represents the least significant 1 bit of the exponent field and 7 bits represent the most significant 7 bits of the mantissa field. In the case of inverse square root, the value of the converted mantissa field varies depending on whether the exponent field is even or odd. By inserting a bit indicating whether the exponent field is even or odd as the most significant bit of the index, and by entering in a table values corresponding to the resulting indexes, a table in which parity is considered results.

Since the table is configured as described above, entry values therein may not represent continuous despite the fact that the indexes referring to them are continuous. Discontinuity occurs when one of the indexes is such that the most significant 1 bit is 0 and the lower-order bits are all 1s, and an index in which the most significant 1 bit is 1 and the lower-order bits are all 0s. The entries referred to by these indexes represent the values of converted exponent fields corresponding to an even exponent field and an odd exponent field, respectively. Therefore, discontinuity occurs. The arithmetic unit according to the third embodiment addresses the discontinuity by a unique process which ensures that a normal value is output by using the same table. As in the foregoing embodiments, the number of indexes is defined by a sum of 1 and the number that can be represented by 8 bits.

Before describing the structure of the arithmetic unit according to this embodiment, a description will be given of an algorithm for computing an inverse square root in this embodiment. Representing the argument x as in expression 1 of the first embodiment, $1/\sqrt{|x|}$ will be given by:

$$1/\sqrt{|x|} = 1/\sqrt{|(-1)^s * 2^{e-127} * (1 + m/2^{23})|} \quad \text{(expression 14)}$$
$$= 1/\sqrt{\{(-1)^0 * 2^{e-127} * (1 + m/2^{23})\}}.$$

Modifying this, we obtain:

$$1/\sqrt{|x|} = \sqrt{\{(-1)^0\}} * \sqrt{\{2^{127-e}\}} * \quad \text{(expression 15)}$$
$$\sqrt{\{1/(1 + m/2^{23})\}}$$
$$= (-1)^0 * \sqrt{\{2^{127-e-1}\}} *$$
$$\sqrt{\{2/(1 + m/2^{23})\}}.$$

The expression is expanded differently depending on whether the exponent field 12 is even or odd. If the exponent field 12 is even, the expression is expanded as follows.

$$1/\sqrt{|x|} = (-1)^0 * \sqrt{\{2^{126-e}\}} * \sqrt{\{2/(1 + m/2^{23})\}} \quad \text{(expression 16)}$$
$$= (-1)^0 * \sqrt{\{2^{2(63-e/2)}\}} *$$
$$\sqrt{\{1 + (1 - m/2^{23})/(1 + m/2^{23})\}}$$
$$= (-1)^0 * 2^{(63-e/2)} *$$
$$\sqrt{\{1 + (1 - m/2^{23})/(1 + m/2^{23})\}}$$
$$= (-1)^0 * 2^{(63+127-e/2-127)} *$$
$$\sqrt{\{1 + (1 - m/2^{23})/(1 + m/2^{23})\}}$$
$$= (-1)^0 * 2^{(190-e/2-127)} *$$
$$\sqrt{\{1 + (1 - m/2^{23})/(1 + m/2^{23})\}}$$

e', the converted exponent field 202, and m', the converted mantissa field 204, are defined as follows.

$$e' = 190 - e/2 \quad \text{(expression 17)}$$

$$m' = (\sqrt{\{1+(1-m/2^{23})/(1+m/2^{23})\}} - 1) * 2^{23}.$$

Using these, $1/\sqrt{|x|}$ is given by:

$$1/\sqrt{|x|} = (-1)^0 * 2^{e'-127} * (1 + m'/2^{23}). \quad \text{(expression 18)}$$

If the exponent field 12 is odd, expression 15 is expanded as follows.

$$1/\sqrt{|x|} = (-1)^0 * \sqrt{\{2^{126-e}\}} * \sqrt{\{2/(1 + m/2^{23})\}} \quad \text{(expression 19)}$$
$$= (-1)^0 * \sqrt{\{2^{2(63-(e+1)/2)+1}\}} *$$
$$\sqrt{\{1 + (1 - m/2^{23})/(1 + m/2^{23})\}}$$
$$= (-1)^0 * 2^{(63-(e+1)/2)} * \sqrt{\{2\}} *$$
$$\sqrt{\{1 + (1 - m/2^{23})/(1 + m/2^{23})\}}$$
$$= (-1)^0 * 2^{(63+127-(e+1)/2-127)} *$$

-continued $$\sqrt{\{2\}} * \sqrt{\{1 + (1 - m/2^{23})/(1 + m/2^{23})\}}$$
$$= (-1)^0 * 2^{(190-(e+1)/2-127)} *$$
$$\sqrt{\{2 + 2(1 - m/2^{23})/(1 + m/2^{23})\}}$$

e', the converted exponent field 202, and m', the converted mantissa field 204, are defined as follows.

$$e' = 190 - (e+1)/2 \quad \text{(expression 20)}$$

$$m' = (\sqrt{\{2+2(1-m/2^{23})/(1+m/2^{23})\}} - 1)*2^{23}.$$

Using these, $1/\sqrt{|x|}$ is given by:

$$1/\sqrt{|x|} = (-1)^0 * 2^{e'-127} * (1 + m'/2^{23}). \quad \text{(expression 21)}$$

By changing the converted exponent field 202 and the converted mantissa field 204 depending on whether the exponent field 12 is odd or even, as indicated by expressions 17 and 20, $1/\sqrt{|x|}$ is represented by the same expression as indicated by expressions 18 and 21. The above process requires switching between operations depending on whether the exponent field 12 is even or odd. Therefore, a branching process is required. In order to avoid a branching process, this embodiment uses as an index the 8-bit value obtained by combining the least significant 1 bit of the exponent field 12 and the most significant 7 bits of the mantissa field 14.

Thus, the least significant 1 bit of the exponent field 12 is used to distinguish between even and odd. That is, the most significant 1 bit of the 8 bits forming the index indicates whether the exponent field is even or odd. In the case of an even number, indexes from "0" to "127" and associated entries are used. In the case of an odd number, indexes from "128" to "255" and associated entries are used. Thus, entries to be retrieved if the exponent field is even and entries to be retrieved if the exponent field is odd are stored in the table. More specifically, the values of the converted mantissa field 204, which are differently represented as indicated by expressions 17 and 20 depending on whether the exponent field is even or odd, are entered in the table, half of the entries being for the even number and the other half being for the odd number.

Similarly to the first embodiment, the table is provided with 257 indexes and entries. The 8-bit index is used to retrieve from the table two adjacent entries. An approximate solution is determined by using these two entries.

The tentative return value A is given by:

$$a = (-1)^{-s} * 2 e'^{-127} * (1 + m'/2^{23}). \quad \text{(expression 22)}$$

The converted exponent field 202 and the converted mantissa field 204 are given by:

$$e' = (380 - e)/2 \quad \text{(expression 23)}$$

$$m' = \text{table0}[e[7]m[0:6]].$$

table0[e[7]m[0:6]] represents a value (i.e., an entry value in the table) retrieved from the table by using the least significant 1 bit of the exponent field 12 and the most significant 7 bits of the mantissa field 14 as an index. The entry value represents the converted mantissa field 204. The size of an entry in the table is 23 bits. table0[i], the ith entry in the table, stores an integer representing the value of m' given by expression 17 or expression 20.

Meanwhile, the tentative return value B is given by:

$$b = (-1)^{-s} * 2 e'^{-127} * (1 + m'/2^{23}). \quad \text{(expression 24)}$$

The converted exponent field 202 is given by:

$$e' = (379 - e)/2 \text{ (if } e[7]m[0:6] \text{ is 127)} \quad \text{(expression 25)}$$

$$e' = (380 - e)/2 \text{ (if } e[7]m[0:6] \text{ is other than 127)}. \quad \text{(expression 26)}$$

The converted mantissa field 204 is given by:

$$m' = \text{table0}[e[7]m[0:6]+1]. \quad \text{(expression 27)}$$

Referring to expressions 25 and 26, different operations are performed depending on whether e[7]m[0:6] is 127 or otherwise. The reason for this will be given. If e[7]m[0:6] is 127, the most significant bit of the second value b used in linear interpolation (i.e., the index e[7]m[0:6]+1 used to determine the converted mantissa field 204B) is 1. Therefore, continuity between a and b is not maintained. To be more specific, the entries corresponding to the indexes "127" and "128" are boundaries that occur between a group of entries corresponding to even numbers and a group of entries corresponding to odd numbers, as mentioned before. Thus, if the index (e[7]m[0:6]) for generating "a" is 127, the index (e[7]m[0:6]+1) for generating "b" will be 128, resulting in the usage of an entry adapted for an odd number. As a result, discontinuity between a and b occurs. To remedy this discontinuity, correction is performed to subtract from the value of e' by 1 if the 8-bit value (e[7]m[0:6]) is 127. The operation is represented by expression 25.

Letting c denote a value obtained by converting the least significant 16 bits of the mantissa field 14 into a 32-bit floating-point number, $1/\sqrt{|x|}$ is given by:

$$c = m[7:22]/2^{16} \quad \text{(expression 28)}$$

$$1/\sqrt{|x|} = (1/\sqrt{|x_1|} - 1/\sqrt{|x_0|}) * (m[7:22]/2^{16}) + 1/\sqrt{|x_0|} = (b-a)*c + a. \quad \text{(expression 29)}$$

As described above, $1/\sqrt{|x|}$ is derived by interpolating between a and b in accordance with c. The arithmetic unit according to this embodiment is configured to perform the operations of expressions 22 through 29.

The converted values e' and m' are verified to determine if they fall within a proper range. Since $0 \le e \le 255$, e' may take the value −190.

m' is given by:

$$m' = (\sqrt{\{1+(1-m/2^{23})/(1+m/2^{23})\}} - 1)*2^{23} \text{ (if } e = \text{even number)}. \quad \text{(expression 30)}$$

Therefore, $$0 < m' \le (\sqrt{\{2\}} - 1)*2^{23} < 2^{23} \quad \text{(expression 31)}$$

$$m' = (\sqrt{\{2+2(1-m/2^{23})/(1+m/2^{23})\}} - 1)*2^{23} \text{ (if } e = \text{odd number)}. \quad \text{(expression 32)}$$

Therefore, $$(\sqrt{\{2\}} - 1)*2^{23} < m' \le 2^{23}. \quad \text{(expression 33)}$$

Since m' is determined by referring to the table as described above, $m' < 2^{23}$.

Therefore, $$(\sqrt{\{2\}} - 1)*2^{23} < m' < 2^{23}. \quad \text{(expression 34)}$$

Taking expressions 31 and 34 together, we obtain:

$$0 < m' < 2^{23}. \quad \text{(expression 35)}$$

That is, e', the converted exponent field 202, is represented by an 8-bit unsigned integer. m', the converted mantissa field 204, is represented by a 23-bit unsigned integer.

The image display apparatus 100 according to the third embodiment is of the same type as the image display apparatus 100 shown in FIG. 2. The structure and constituting elements thereof are, however, different in some aspects. The following description primarily concerns the differences.

The decomposer 28 decomposes the input argument into the sign field 10, the exponent field 12 and the mantissa field 14, similarly to the first embodiment. The decomposer 28 outputs the least significant 1 bit of the exponent field 12 and the mantissa field 14 to the retrieving unit 34. The signal line for outputting the least significant 1 bit of the exponent field 12 from the decomposer 28 to the retrieving unit 34 is not shown in FIG. 2. The first converter 30 converts the sign field 10 into a positive value and outputs the result as the converted sign field 200 to the deriving unit 36. The second converter 32 computes expression 25 or expression 26. The computation involves division by 2, unlike the first embodiment. Division by 2 is implemented by shifting the bits and substantially requires only a slight increase in the amount of processing.

The storage 38 stores in a table values obtained by converting the mantissa field 14 according to a predetermined mantissa conversion rule defined in accordance with the function. Since the target function is for computing inverse square roots, the conversion rule is represented by expression 17 for m' or expression 20 for m'.

That is, if the least significant bit of the exponent field 12 is "0", m' given by expression 17 represents an entry. If the least significant bit of the exponent field 12 is "1", m' given by expression 20 represents an entry. The former corresponds to the case where the exponent field 12 is even and the latter corresponds the case where the exponent field 12 is odd.

The index to search the table stored in the storage 38 comprises the least significant 1 bit of the exponent field 12 and the most significant 7 bits of the mantissa field so that the mantissa field 14 is at least included. Thus, values approximating the argument in this way are used as an index. Similar to the foregoing embodiments, the number of indexes in the table is defined to be 257 (=256+1).

FIG. 9 shows the data structure of the table stored in the storage 38 according to the third embodiment. "Index" and "entry" of FIG. 9 correspond to "index" and "entry" of FIG. 3. The number of indexes is defined to be 257 ("0" through "256") as shown in FIG. 3. The indexes from "0" to "127" correspond to the case where the least significant 1 bit of the exponent field 12 is 0. Entries associated with these indexes are represented by m' in expression 17. The indexes from "128" to "256" correspond to the case where the least significant 1 bit of the exponent field 12 is 1. Entries associated with these indexes are represented by m' in expression 20.

Returning to the description of the image display apparatus 100 according to the third embodiment, the retrieving unit 34 derives the two indexes as a result of the above process. Thereafter, the retrieving unit 34 uses the two indexes to retrieve two entries from the table stored in the storage 38. More specifically, the retrieving unit 34 retrieves from the table of FIG. 3 two entries corresponding to the two indexes. The two entries thus retrieved are represented by m' of expression 7 and m' of expression 9, respectively. The two entries are output to the deriving unit 36 as converted mantissa fields 204.

The retrieving unit 34 derives the indexes of the table stored in the storage 38 by synthesizing the most significant 7 bits of the mantissa field 14 and the least significant 1 bit of the exponent field 12, i.e., by approximating at least the mantissa field 14. In order to retrieve two indexes, the retrieving unit 34 additionally derives a value by adding 1 to the index mentioned above. The subsequent process of retrieving the two converted mantissa fields 204 from the storage 38 by using the two indexes thus derived is similar to that of the first embodiment so that the description thereof is omitted.

The deriving unit 36 generates the tentative return value A and the tentative return value B from the converted sign field 200, the converted exponent field 202 and the two converted mantissa fields 204. Further, the deriving unit 36 interpolates between the tentative return value A and the tentative return value B so as to generate the return value 208. The operations for generating the tentative return values are represented by expressions 22 and 24. Interpolation is in accordance with expressions 28 and 29. Since these operations are substantially identical with those described in the first embodiment, the description thereof is omitted.

If the two indexes retrieved by the retrieving unit 34 are "127" and "128", i.e., if the entry values stored in the storage 38 in association with the two indexes are discontinuous, the following process is performed. In accordance with a predetermined instruction, the second converter 32 additionally derives a value obtained by subtracting a predetermined value from the converted exponent field 202. This is represented by expression 25. The deriving unit 36 generates the tentative return value A as usual. The tentative return value B is generated by using, as the converted exponent field 202, a value obtained by subtracting 1 from the converted exponent field 202. Further, the return value 208 is derived by referring to the tentative return value A and the tentative return value B. The principle behind the above operation will be described. Referring to FIG. 9, the entry value indexed by "127" is "0x4030" and the entry value indexed by "128" is "0x7fffff". Assuming that the entry indexed by "128" has a value of "0x000000", the tentative return value B can be computed by expression 26. Since an odd value "0x7fffff" is actually stored, approximation is achieved by subtracting 1 from the exponent field. That is, the following relationship is used.

$$2^{\wedge}(e-127) * (0 \times 000000 / 0 \times 800000) \approx \qquad \text{(expression 36)}$$
$$2^{\wedge}(e-127-1) * (0 \times 7\textit{fffff} / 0 \times 800000).$$

Figure 10:
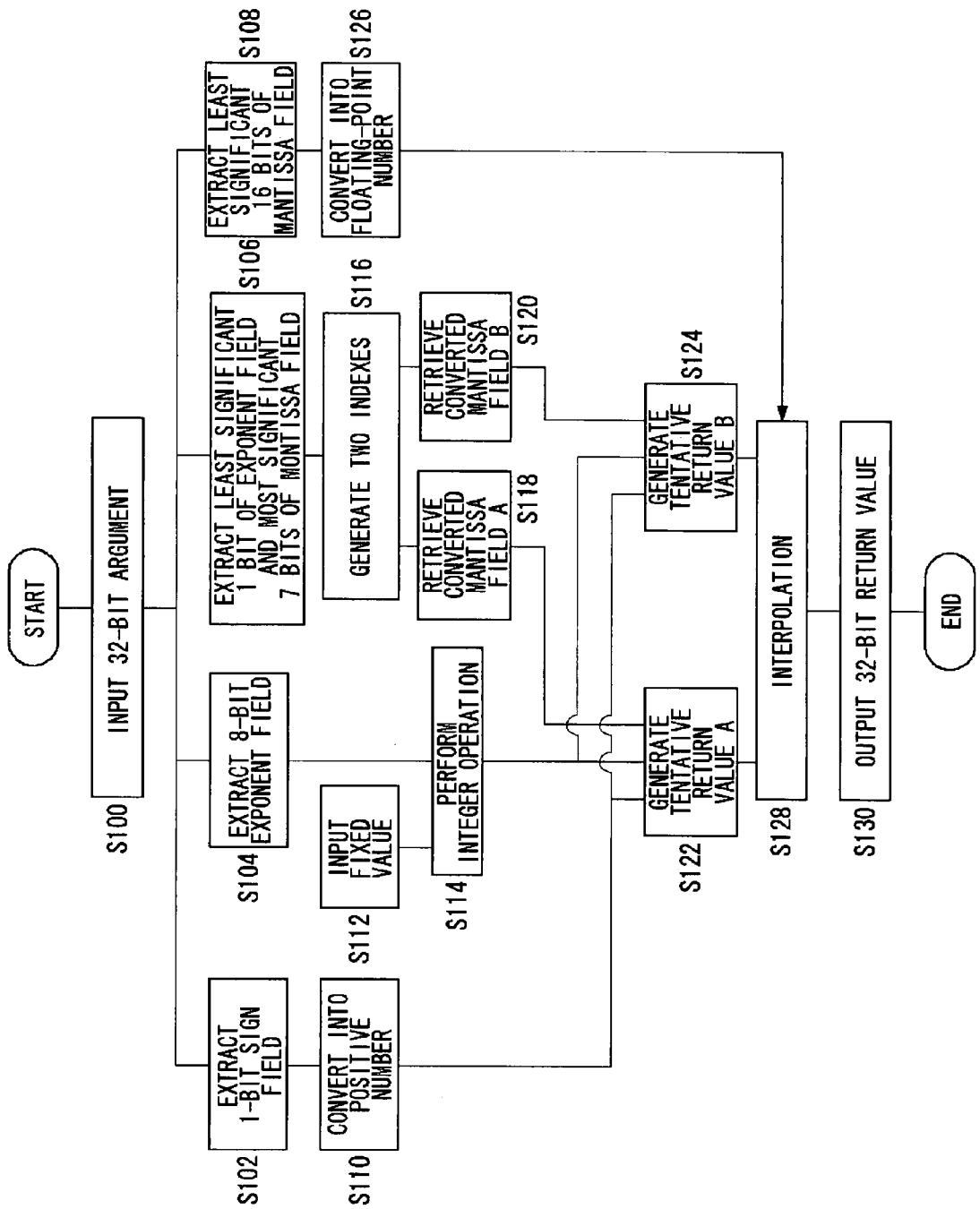
FIG. 10 is a schematic view showing the procedure for arithmetic operation by the arithmetic unit.

FIG. 10 is a schematic view showing the procedure for arithmetic operation by the arithmetic unit 24. The input unit 26 receives a 32-bit argument (S100). The decomposer 28 decomposes the input argument. More specifically, the decomposer 28 extracts the sign field 10 (S102), extracts the 8-bit exponent field 12 (S104) and extracts the least significant 1 bit of the exponent field and the most significant 7 bits of the mantissa field 14 (S106). The first converter 30 converts the sign field 10 into a positive number (S110) and outputs the result as the converted sign field 200. The second converter 32 receives a fixed value "380" (S112), performs an integer operation indicated by expression 26 on the fixed value and the exponent field 12 and outputs the converted exponent field 202. A description of the integer operation as indicated by expression 25 is omitted. The retrieving unit 34 generates two indexes from the least significant 1 bit of the exponent field 12 and the most significant 7 bits of the mantissa field 14 (S116). The retrieving unit 34 retrieves the converted mantissa field 204A from the storage 38 (S118) and also retrieves the converted mantissa field 204B (S120).

The deriving unit 36 generates the tentative return value A from the converted sign field 200, the converted exponent field 202 and the converted mantissa field 204A (S122) and also generates the tentative return value B from the converted sign field 200, the converted exponent field 202 and the converted mantissa field 204B (S124). Further, the deriving unit 36 extracts the least significant 16 bits of the mantissa field 14 (S108) and converts the least significant 16 bits of the mantissa field 14 into a floating-point number (S126). The deriving unit 36 interpolates between the tentative return value A and the tentative return value B in accordance with the converted floating-point number (S128) so as to generate a return value. Finally, the deriving unit 36 outputs the 32-bit return value (S130).

According to the embodiments, approximate values of the exponent field and the mantissa field are used to generate the indexes of the table. Accordingly, the table size is reduced. Since a value obtained by adding 1 to the maximum number that the approximate value can take is defined as the number of indexes, multiple indexes can be generated for each of the approximate values. Therefore, precision of the return value is expected to be improved. Since the exponent field is merely subjected to subtraction and bit shift, the amount of processing is reduced. Since the return value is derived by interpolating between multiple values retrieved from the table, precision in the return value representing the inverse square root is improved. Since multiplication is performed only in interpolation, the amount of processing can be reduced.

Computation of inverse square roots can be performed with high precision while also preventing an increase in the amount of processing. Since the least significant 1 bit of the exponent field is included in the index, a single table can store converted mantissa fields irrespective of whether the exponent field is even or odd. Even if the two values retrieved are discontinuous, continuity between the two values is maintained by a process whereby the value of the converted exponent field is reduced. Further, an inverse square root can be computed with at least 16-bit precision. Additionally, inverse square roots can be computed by referring to the table with 23-bit entries indexed by 257 indexes.

Fourth Embodiment

The fourth embodiment relates to an arithmetic unit which computes the square root of an argument represented in the floating-point format. The arithmetic unit according to the fourth embodiment is capable of computing a square root with a structure similar to that of the arithmetic unit according to the third embodiment.

Before describing the structure of the arithmetic unit according to this embodiment, a description will be given of an algorithm for computing a square root. The algorithm is substantially equal to the algorithm for computing an inverse square root. Only the expressions will be listed.

$\sqrt{|x|}$ is given by:

$$\sqrt{|x|} = \sqrt{|(-1)^s * 2^{e-127} * (1+m/2^{23})|} \quad \text{(expression 37)}$$
$$= \sqrt{\{(-1)^0 * 2^{e-127} * (1+m/2^{23})\}}.$$

Expanding this similarly to $1/\sqrt{|x|}$, the tentative return value A is given by:

$$a=(-1)^{-s}*2^{e'-127}*(1+m'/2^{23}).$$

The converted exponent field 202 and the converted mantissa field 204 are given by:

$$e'=(e+127)/2 \quad \text{(expression 39)}$$

m'=table0[e[7]m[0:6]].

The tentative return value B is given by:

$$b=(-1)^{-s}*2^{e'-127}*(1+m/2^{23}). \quad \text{(expression 40)}$$

The converted exponent field 202 is given by:

$$e'=(e+129)/2 (\text{if } e[7]m[0:6] \text{ is } 127) \quad \text{(expression 41)}$$

$$e'=(e+127)/2 (\text{if } e[7]m[0:6] \text{ is other than } 127). \quad \text{(expression 42)}$$

The converted mantissa field 204 is given by:

$$m'=\text{table0}[e[7]m[0:6]+1]. \quad \text{(expression 43)}$$

Letting c denote a value obtained by converting the least significant 16 bits of the mantissa field 14 into a 32-bit floating-point number, $1/\sqrt{|x|}$ is given by:

$$c=m[7:22]/2^{16} \quad \text{(expression 44)}$$

$$\sqrt{|x|}=(\sqrt{|x_1|}-\sqrt{|x_0|})*(m[7:22]/2^{16})+\sqrt{|x_0|}=(b-a)*c+a. \quad \text{(expression 45)}$$

The image display apparatus 100 according to the fourth embodiment is of the same type as the image display apparatus 100 according to the third embodiment, the only difference being that the second converted 32 is adapted to both expression 41 and expression 42, and the entry values stored in the storage 38 are adapted to expression 37. Therefore, a description of the image display apparatus 100 of the fourth embodiment will be omitted.

The fourth embodiment enables computation of square roots while also providing the advantages described in the third embodiment.

The description of the invention given above is based upon the embodiments. The embodiments are illustrative in nature and various variations in constituting elements and processes involved are possible. Those skilled in the art would readily appreciate that such variations are also within the scope of the present invention.

In the first and second embodiments of the present invention, the second converter 32 performs subtraction between the fixed value and the exponent field 12. Alternatively, the second converter 32 may perform addition. In this case, the sign of the exponent field 12 is inverted before being added to the fixed value. This variation allows diversified structures of the second converter 32. What is essential is that a heavy process such as multiplication is not required.

In the first through fourth embodiments, the retrieving unit 34 generates two indexes and retrieves two converted mantissa fields 204 from the storage 38 by using the two indexes. Alternatively, the retrieving unit 34 may generate multiple indexes and retrieve multiple converted mantissa fields 204 from the storage 38 by using the multiple indexes. In this case, interpolation is modified to adapt to multiple converted mantissa fields 204 or multiple tentative return values. According to this variation, precision in the approximate value is improved. Thus, what is essential is that two or more converted mantissa fields 204 are used.

In the first through fourth embodiments of the present invention, computation of reciprocals, inverse square roots and square roots performed by the arithmetic unit 24 has been described. Alternatively, the arithmetic unit 24 may compute other functions. According to this variation, the present invention can be used in various functions on the sole condition that computation is on arguments that are represented in the floating-point format. What is essential, therefore, is that arithmetic operation deals with an argument represented in the floating-point format.

In the first through fourth embodiments of the present invention, the arithmetic unit 24 is designed to perform one of reciprocal, inverse square root and square root operations. Alternatively, the arithmetic unit 24 may be capable of performing multiple functions. In this case, the storage 38 stores entries adapted to multiple functions, and the arithmetic unit 24 receives an instruction indicating the type of function to be computed. In accordance with the instruction, the arithmetic unit 24 performs an arithmetic operation by specifying a processing method in, for example, the first converter 30. According to this variation, the arithmetic unit 24 is made compatible with various functions while also preventing the circuit scale from being increased. What is essential, therefore, is that the operation deals with an argument represented in the floating-point format.

An arbitrary combination of the first through fourth embodiments will also be useful. According to this variation, advantages associated with the combination will be available.

While the preferred embodiments of the present invention have been described using specific terms, such description is for illustrative purposes only, and it is to be understood that changes and variations may be made without departing from the spirit or scope of the appended claims.

The invention claimed is:

1. An arithmetic unit comprising:
an input unit which receives an argument of a function represented in a floating-point format that includes an exponent field and a mantissa field;
a converter which converts the exponent field included in the input argument according to an exponent conversion rule defined in accordance with the function;
a storage which stores a table that includes a plurality of indexed values obtained by approximating the mantissa field included in the argument according to a mantissa conversion rule defined in accordance with the function;
a retrieving unit which derives two indexes of the table, namely, a value approximating at least the mantissa field of the input argument by high-order bits of the mantissa field and a value obtained by adding 1 to the approximate value, and which retrieves two values from the table stored in the storage, by using the two indexes thus derived; and
a deriving unit which derives a return value of the function represented in the same floating-point format as that of the argument, in accordance with the converted exponent field and the two values retrieved, and which outputs the return value, wherein
the number of indexes in the table stored in the storage is defined to be a sum of 1 and the maximum number taken by the approximate value of at least the mantissa field of the argument, by adding an index obtained by adding 1 to the maximum approximate value of at least the mantissa field of the argument,
a curve that connects true solutions between the respective two indexes acquired by the retrieving unit is a concave downward curve, and a straight line that connects the respective values for the two indexes stored in the storage is located below the curve, and
the curve and the straight line are closest to each other at a location other than the two indexes.

2. The arithmetic unit according to claim 1, wherein the function corresponding to the argument received by the input unit is an operation for computing a reciprocal of the argument,
a value approximating the mantissa field of the argument by high-order bits of the mantissa field is defined as the index in the table and stored in the storage, and
the retrieving unit derives an approximate value of the mantissa field of the argument using high-order bits of the mantissa field and a value obtained by adding 1 to the approximate value as the plurality of indexes of the table.

3. The arithmetic unit according to claim 2, wherein the deriving unit derives two tentative return values represented in the same floating-point format as that of the argument, the tentative return values respectively corresponding to the plurality of values retrieved by the retrieving unit, and
the deriving unit derives the return value of the function by interpolating between the two tentative return values.

4. The arithmetic unit according to claim 2, wherein the deriving unit interpolates between the plurality of values retrieved by the retrieving unit and derives the return value of the function from the result of interpolation and the converted exponent field.

5. The arithmetic unit according to claim 1, wherein the function corresponding to the argument received by the input unit is an operation for computing a square root of the argument,
a value formed by the least significant bit of the exponent in the argument and by an approximate value of the mantissa field of the argument using high-order bits of the mantissa field is defined as the index in the table and stored in the storage, and
the retrieving unit derives, as the plurality of indexes of the table: a value formed by the least significant bit of the exponent field of the input argument and by an approximate value of the mantissa field using high-order bits of the mantissa field; and a value obtained by adding 1 to the value thus formed.

6. The arithmetic unit according to claim 5, wherein if a first value, retrieved from the table stored in the storage by using the value formed by retrieving unit as an index, and a second value, retrieved from the table by using the value obtained by adding 1 to the formed value, are discontinuous, the converter additionally derives a value by subtracting a predetermined value from the converted exponent field, in converting the exponent field included in the input argument,
the deriving unit derives a tentative return value from the first value and the converted exponent field obtained by the converter and also derives another tentative return value from the second value and the value derived by subtracting the predetermined value from the converted exponent field, and
the deriving unit derives the return value of the function by interpolating between the two tentative return values.

7. The arithmetic unit according to claim 1, wherein the function corresponding to the argument received by the input unit is an operation for computing an inverse square root of the argument,
a value formed by the least significant bit of the exponent in the argument and by an approximate value of the mantissa field of the argument using high-order bits of the mantissa field is defined as the index in the table and stored in the storage, and
the retrieving unit derives, as the plurality of indexes of the table: a value formed by the least significant bit of the exponent field of the input argument and by an approximate value of the mantissa field using high-order bits of the mantissa field; and a value obtained by adding 1 to the value thus formed.

8. A non-transitory computer-readable storage medium storing a program which causes an arithmetic unit to execute the steps of:
receiving via a predetermined interface an argument of a function represented in a floating-point format that includes an exponent field and a mantissa field;
converting the exponent field included in the input argument according to an exponent conversion rule defined in accordance with the function;
deriving, in order to refer to a table storing a plurality of indexed values obtained by approximating the mantissa field included in the argument according to a mantissa conversion rule defined in accordance with the function, two indexes of the table, namely, a value approximating at least the mantissa field of the input argument by high-order bits of the mantissa field and a value obtained by adding 1 to the approximate value, and retrieving two values from the table, by accessing the memory using the two indexes thus derived; and deriving a return value of the function represented in the same floating-point format as that of the argument, in accordance with the converted exponent field and the two values retrieved, and outputting the return value, wherein the number of indexes in the table referred to in the retrieving is defined to be a sum of 1 and the maximum number taken by the approximate values of at least the mantissa field of the argument, by adding an index obtained by adding 1 to the maximum approximate value of at least the mantissa field of the argument, a curve that connects true solutions between the respective two indexes acquired in the retrieving is a concave downward curve, and a straight line that connects the respective values for the two indexes stored in the table is located below the curve, and the curve and the straight line are closest to each other at a location other than the two indexes.

* * * * *